(12) United States Patent
Khalifa et al.

(10) Patent No.: US 9,647,231 B2
(45) Date of Patent: May 9, 2017

(54) ELECTRICAL CONNECTION OF AN OLED DEVICE

(71) Applicant: ASTRON FIAMM SAFETY, La Farlede (FR)

(72) Inventors: Mohamed Khalifa, La Valette du Var (FR); Bruno Dussert-Vidalet, La Garde (FR); Vincent Michalcik, Toulon (FR)

(73) Assignee: ASTRON FIAMM SAFETY, La Farlede (FR)

( * ) Notice: Subject to any disclaimer, the term of this patent is extended or adjusted under 35 U.S.C. 154(b) by 184 days.

(21) Appl. No.: 14/442,339

(22) PCT Filed: Nov. 8, 2013

(86) PCT No.: PCT/EP2013/073440
§ 371 (c)(1),
(2) Date: May 12, 2015

(87) PCT Pub. No.: WO2014/076018
PCT Pub. Date: May 22, 2014

(65) Prior Publication Data
US 2016/0276621 A1    Sep. 22, 2016

(30) Foreign Application Priority Data

Nov. 14, 2012   (FR) ...................................... 12 60825

(51) Int. Cl.
*H01L 51/52* (2006.01)
*H01L 27/32* (2006.01)
(Continued)

(52) U.S. Cl.
CPC ...... *H01L 51/5246* (2013.01); *H01L 27/3237* (2013.01); *H01L 27/3288* (2013.01);
(Continued)

(58) Field of Classification Search
CPC ............... H01L 51/50–51/5096; G09G 3/3208
See application file for complete search history.

(56) References Cited

U.S. PATENT DOCUMENTS 6,150,187 A * 11/2000 Zyung ................. H01L 51/5253
                                                      438/126
6,515,417 B1 * 2/2003 Duggal ............... H01L 27/3211
                                                      313/504
(Continued)

FOREIGN PATENT DOCUMENTS

EP     2 267 780 A2   12/2010
EP     2 315 252 A2    4/2011
(Continued)

OTHER PUBLICATIONS

International Search Report, dated Dec. 16, 2013, from corresponding PCT application.
(Continued)

*Primary Examiner* — Caridad Everhart
*Assistant Examiner* — Ankush Singal
(74) *Attorney, Agent, or Firm* — Young & Thompson

(57) ABSTRACT

Disclosed is a method for the production of an organic light emitting device of the OLED type, the method including the following sequences of steps: a step of forming a stack of layers on a substrate; the stack including, successively and in the following order, a first electrode, an organic layer and a second electrode; a step of positioning a cover; a step of forming a connection pad. The method also includes: a step of fixing a first end of at least one elongated electrical connection member to an area of the connection pad covering a portion of the second face of the cover and a step of forming a layer of resist, the layer of resist being so
(Continued)

configured as to preserve an electrical access to a second end of the elongated electrical connection member above the layer of resist.

9 Claims, 9 Drawing Sheets

(51) Int. Cl.
  *H01L 51/00* (2006.01)
  *H01L 51/56* (2006.01)
(52) U.S. Cl.
  CPC ...... *H01L 51/0021* (2013.01); *H01L 51/5203* (2013.01); *H01L 51/524* (2013.01); *H01L 51/5209* (2013.01); *H01L 51/5225* (2013.01); *H01L 51/5253* (2013.01); *H01L 51/56* (2013.01); *H01L 2251/301* (2013.01); *H01L 2251/5361* (2013.01)

(56) References Cited

U.S. PATENT DOCUMENTS

| | | | | |
|---|---|---|---|---|
| 8,692,263 | B2* | 4/2014 | Nam | H01L 27/3276 257/40 |
| 8,847,269 | B2* | 9/2014 | Yamamuro | H01L 51/529 257/40 |
| 2002/0130615 | A1* | 9/2002 | Saito | H01L 51/5203 313/506 |
| 2005/0248270 | A1* | 11/2005 | Ghosh | H01L 51/5259 313/512 |
| 2006/0043912 | A1 | 3/2006 | Foust et al. | |
| 2006/0059705 | A1* | 3/2006 | Wang | B01D 53/28 34/72 |
| 2007/0216295 | A1* | 9/2007 | Shimizu | H01L 51/5048 313/506 |
| 2008/0191357 | A1* | 8/2008 | Kouno | H01L 24/03 257/762 |
| 2008/0213621 | A1* | 9/2008 | Takashima | H05B 33/10 428/690 |
| 2009/0302760 | A1 | 12/2009 | Tchakarov et al. | |
| 2010/0046210 | A1 | 2/2010 | Mathai et al. | |
| 2011/0070672 | A1* | 3/2011 | Lee | H01L 51/5253 438/26 |
| 2011/0096504 | A1* | 4/2011 | Hild | H01L 51/529 361/704 |
| 2011/0175860 | A1* | 7/2011 | Kojima | H01L 33/54 345/204 |
| 2012/0132950 | A1* | 5/2012 | Yamamuro | H01L 51/529 257/99 |
| 2013/0126858 | A1* | 5/2013 | Boerner | H01L 51/5237 257/40 |
| 2014/0246665 | A1* | 9/2014 | Lang | H01L 51/524 257/40 |

FOREIGN PATENT DOCUMENTS

| | | |
|---|---|---|
| JP | H10 199673 A | 7/1998 |
| WO | 2008/012460 A2 | 1/2008 |
| WO | 2009/087585 A1 | 7/2009 |

OTHER PUBLICATIONS

European Office Action dated Jun. 30, 2016, from corresponding priority application.

* cited by examiner

ELECTRICAL CONNECTION OF AN OLED DEVICE

FIELD OF THE INVENTION

The present invention relates to the OLED technology (the acronym for Organic Light-Emitting Diode), based on the use of organic light emitting diodes, which once supplied with an electric current, emit their own light. The present invention concerns, for an advantageous application, a method for manufacturing an organic light emitting device.

OLED technology is particularly attractive because it makes it possible to produce flexible, light-weight, thin, low power consuming, low cost emitting devices able to cover a large area.

TECHNOLOGICAL BACKGROUND

The operation of OLEDs is based on the phenomenon of electro-luminescence, wherein the emission of light results from the action of an electric field or a current flowing through a given substance. In OLEDs, such phenomenon consists in injecting electric charges into an extremely thin layer of an organic material (usually about 100 to 200 nanometers thick). The light thus comes from the emission of a photon generated by the recombination of an exciton (electron-hole pair), within the emitting polymer layer.

Researches on the production and marketing of organic semiconductors, have recently accelerated. Such technologies, initially intended for professionals, now find more and more general public applications, particularly in the field of domestic lighting.

Through their various applications, OLED devices should also take advantage of the development of printed electronics, which is expected to significantly grow in the coming years.

OLEDs could spread for producing small screens integrated in phones, cars, cameras, MP3 players, as well as television screens or billboards.

Today, however, the degradation of such organic devices remains a critical issue. The extreme sensitivity of the organic materials in the presence of water and oxygen imposes a production in an inert atmosphere and a final encapsulation (as is the case for OLED screens, for example).

Currently, electrodes are supplied through portions not covered by the encapsulation of the OLED, and thus induces complicated and, therefore, expensive manufacturing processes with no perfect sealing guaranteed.

Several approaches for electrical connection to light emitting devices have thus been considered. Among these, one solution consists in encapsulating the stack comprising the organic layer using a cover. A metal layer then covers said cover, thus protecting the OLED system from possible ingress of water and oxygen into the system. This approach is mentioned in the patent application EP1 120838A1. In this solution a second perforated cover is used, which is placed on the OLED device, with said OLED device already comprising a first cover. A disadvantage pointed out by this study is the mechanical type contact existing between the encapsulated OLED device and the second cover which may generate a defective contact. On the other hand, the method described is long, and the final OLED device lacks compactness.

The present invention makes it possible to solve all or at least some of the drawbacks of the current techniques.

SUMMARY OF THE INVENTION

The present invention more particularly relates to a method for manufacturing an organic light emitting device of the OLED type, with the method comprising the following sequences of steps:

a step of forming a stack of layers on a substrate; with said stack comprising, successively and in the following order, a first electrode positioned on the substrate, an organic layer positioned in contact with at least a portion of the first electrode, a second electrode positioned in contact with at least a portion of the organic layer, a step of positioning a cover, a first face of which is bonded using an adhesive layer, with said cover being positioned on the stack of layers, so that the layer of adhesive fits the cover and the stack of layers, a step of forming a connection pad so executed that the connection pad covers at least a portion of the second face of the cover and at least a portion of one of the electrodes, It advantageously comprises a step of fixing a first end of at least one elongated electrical connection member to an area of the connection pad covering a portion of the second face of the cover, Preferentially, it further comprises a step of forming a layer of resist covering the entire OLED device; with said layer of resist being so configured as to preserve an electrical access to a second end of the elongated electrical connection member above the layer of resist.

The present invention also relates to an organic light emitting device comprising a stack of layers on a substrate, with said stack comprising, successively and in the following order, a first electrode, an organic layer, a second electrode, an adhesive layer, a cover and a connection pad.

The device advantageously comprises at least one elongated electrical connection member, one end of which is fixed to an area of the connection pad covering a portion of the second cover.

The device preferably comprises a layer of resist so configured as to preserve an electrical access to a second end of at least one elongated electrical connection member above said layer of resist.

Thus, the technical effect of the present invention is that it provides a perfect sealing solution for the OLED device and a guarantee of reliability for the electrical connection. The layers present in the organic light emitting device, known to be particularly sensitive to water and oxygen, are thus perfectly protected by the means used, and in particular by the encapsulation system thanks to the presence of the cover.

The invention also relates to the forming of a connection pad so configured as to cover a large area, and therefore offers the advantage of connecting at least one elongated electrical connection member, anywhere on the cover.

In one possible solution, the invention advantageously provides protection not only to the sensitive layers but also to the electrical connection through the forming of a layer of resist covering the whole volume of the device, including the electric connection(s) thereof.

BRIEF DESCRIPTION OF THE FIGURES

Other features, aims and advantages of the present invention will appear upon reading the following detailed description and referring to the appended drawings given as non-limiting examples and wherein.

Figure 1:
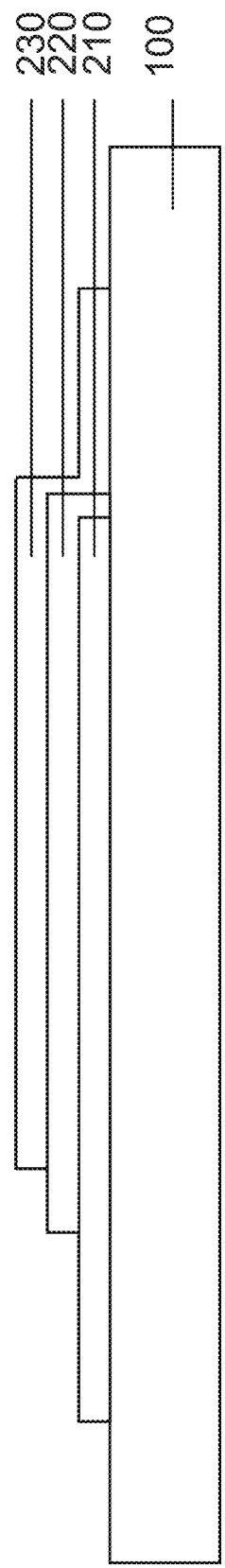
FIG. 1 is a schematic view in longitudinal section of a stack on a substrate consisting of various layers, contained in a device of the OLED type.

For clarity, the elements in the Figures are not shown to scale.

DETAILED DESCRIPTION

It should be noted that, within the scope of the present invention, the word "on" does not necessarily mean "in contact with". Thus, for instance, depositing a first layer on another layer does not necessarily mean that the two layers are directly in contact with each other, but this means that one of the layers at least partially covers the other layer by being either directly in contact therewith or by being separated therefrom by another layer or another element.

Prior to going into details relating to the preferred embodiments of the invention while referring more particularly to the drawings, other optional characteristics of the invention which may be implemented in any combination or alternately, are mentioned hereafter:

the method comprises a step of fixing a first end of at least one elongated electrical connection member 600 to an area of the connection pad 500 covering a portion of the second face of the cover 400, the method comprises a step of forming a layer of resist 700; with said layer of resist 700 being so configured as to preserve an electrical access to a second end of the elongated electrical connection member 600 above the layer of resist 700.

The method comprises a step of positioning the cover 400 to preserve an opening giving access to at least one of the electrodes 210, 230; with said cover 400 having at least one opening.

The method comprises a step of positioning the cover 400 to preserve a space giving access to at least a second electrode 210, 230; with said cover 400 having at least one second opening.

The method comprises a step of positioning the cover 400; so configured as to create at least two access openings making it possible to frame and isolate the organic layer 220.

The method comprises a step of fixing a first end of at least one elongated electrical connection member 600 carried out by soldering.

The method comprises a step of fixing a first end of at least one elongated electrical connection member 600 executed by bonding.

The method according to the invention comprises a step of forming the connection pad 500 characterized by metallisation.

The method according to the invention comprises a step of forming the connection pad 500 characterized by vacuum deposition.

The organic light emitting devices comprises at least one elongated electrical connection member 600, one end of which is fixed to an area of the connection pad 500 covering a portion of the second cover 400.

The device comprises a layer of resist 700; with said layer of resist 700 being so configured as to preserve an electrical access to a second end of at least one elongated electrical connection member 600 above the layer of resist 700.

The device comprises a cover 400 having at least one opening preserving a space giving access to at least one of the electrodes 210, 230.

The device comprises a cover 400 comprising at least one second opening preserving a space giving access to at least a second electrode 210, 230.

The device comprises a cover 400 comprising at least two access spaces filled with the layer of resist 700 making it possible to encapsulate and to protect the first electrode 210, the organic layer 220 and the second electrode 230.

The device comprises a first end of the at least one elongated electrical connection member 600 fixed by soldering or bonding on a portion of the connection pad 500.

The device comprises one elongated electrical connection member 600; such elongated member is mechanically conductive, and the width thereof is of a negligible dimension when compared to the length, with said member possibly being an electrical wire, a metallic leg or a pin.

The device comprises a connection pad 500 made of a material selected from copper (Cu), aluminum (Al), silver (Ag), chromium (Cr), molybdenum (Mo), nickel (Ni), gold (Au).

The device comprises a connection pad 500 formed by a two-layer stack of materials selected from the following combinations: copper/aluminum, copper/silver, copper/molybdenum, copper/chromium, copper/nickel, copper/gold.

The device comprises a connection pad 500 formed by a two-layer stack of materials the layers of which are so configured as to be completely or partially superimposed.

Thus, the effect of the invention is intended to produce an organic light emitting device of the OLED type, whereon at least one elongated electrical connection member is fixed, comprising an electrically conductive member and the longer dimension of which is greater than the thickness and/or the width.

In a first step, illustrated in FIG. 1, a stack of layers 200 is formed on a substrate 100. Advantageously, the substrate 100 is a flat plate made of a transparent material. The substrate 100 is optionally made of glass.

According to a preferred embodiment, the organic layer 220 is preferably so positioned as to be inserted between the first electrode 210 and the second electrode 230.

The first electrode 210 is preferably deposited on the substrate 100. The organic layer 220 is advantageously deposited so as to cover a portion of the first electrode 210. The electrode 210 preferably protrudes laterally from the organic layer 220. Advantageously, the first electrode 210 has a portion which is not covered by the organic layer 220. The second electrode 230 is deposited so as to at least partially cover the organic layer 220. Preferably, the second electrode 230 covers the whole surface of the organic layer 220, without being in contact with the first electrode 210. Preferably, the second electrode 230 extends beyond the organic layer 220 as shown in FIG. 1. The second electrode 230 protrudes laterally from the stack of layers 200. The projecting portion of the first electrode 210 and the projecting portion of the second electrode 230 are not superimposed, nor in contact. They may be located on opposite edges of the stack of layers 200.

Preferably, the first electrode 210 is the anode. The first electrode 210 is typically made of a metallic material.

According to one embodiment wherein light is emitted in the direction opposite the substrate 100, the first electrode 210 is selected so as to be made of a reflective (or semi-reflective) material. The first electrode 210 may be, for example, made of aluminum.

According to a preferred embodiment wherein light is emitted through the substrate 100, the first electrode 210 is selected to be made of a transparent material. The first electrode 210 is preferably made of tin-doped indium oxide (Indium Tin Oxide, ITO). This material has interesting properties as regards electrical conductivity and optical transparency for the manufacturing of an organic light emitting device. Optionally, the first electrode 210 is at least 85% transparent, to allow the transmission of light.

The organic layer 220 is advantageously made of one or more sublayers. Such sublayers preferably comprise specific materials making it possible to improve the injection of electrons and holes, and consequently to improve the efficiency of the light emission device. For example, the organic layer 220 may more particularly comprise a hole injection layer, a hole transport layer, an emission layer of the light produced by the recombination of the holes and the electrons, an electron transport layer and an electron injection layer.

The second electrode 230 is generally the cathode. The second electrode 230 is advantageously transparent. Optionally, it is semi-transparent. The second electrode 230 is typically made of a metallic material. The second electrode 230 may, for example, be made of a material such as aluminium or calcium. It is preferably deposited by thermal evaporation or by cathode sputtering.

The thickness of the first electrode 210, the organic layer 220 and the second electrode 230 is advantageously between 10 nm and 200 nm.

According to a preferred embodiment, the different layers are deposited in a controlled atmosphere. As a matter of fact, the presence of impurities depends on the atmosphere wherein the structures have been manufactured.

Figure 2:
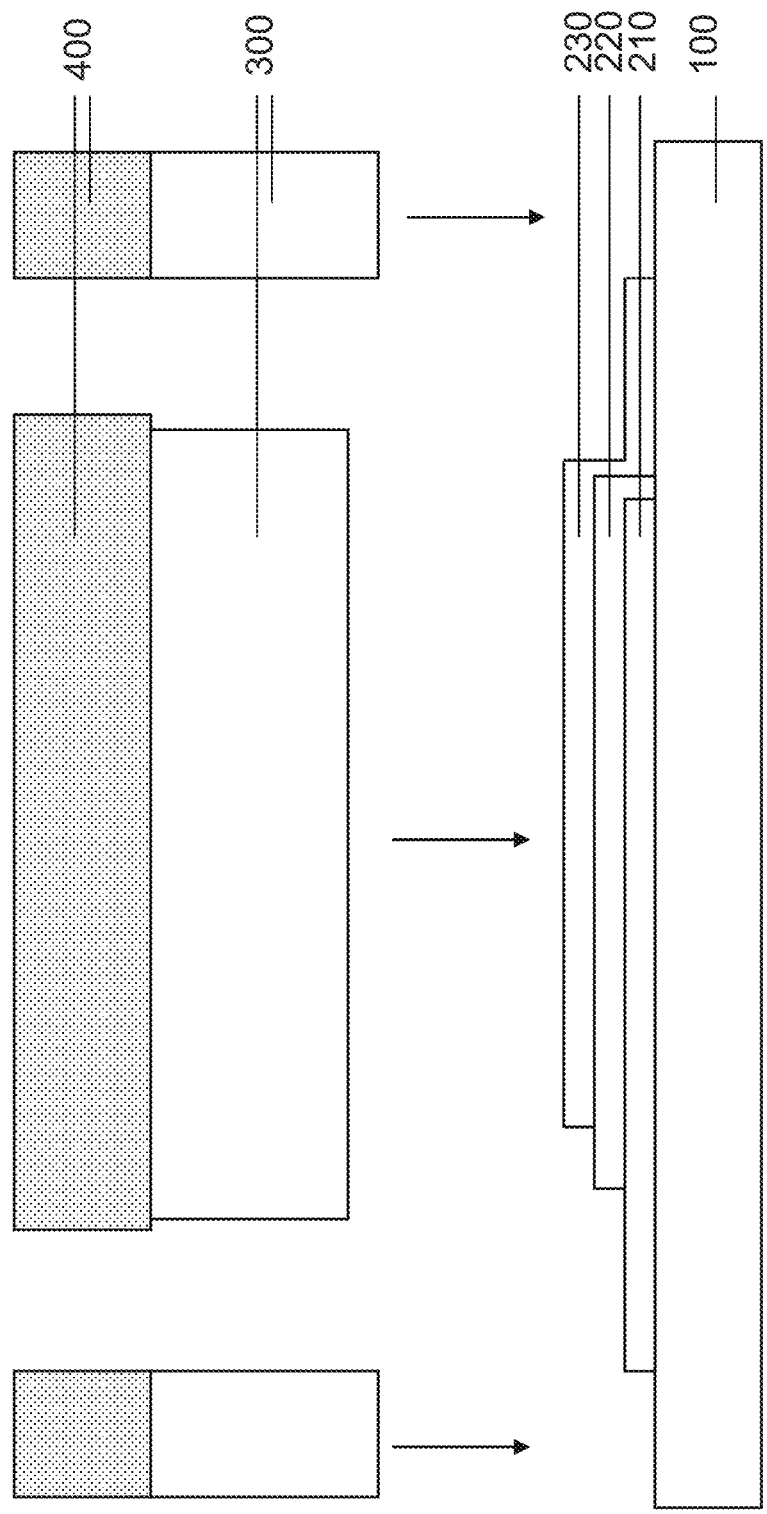
FIG. 2 is a schematic view of the step of positioning a cover, one face of which has previously been glued, which covers said stack of layers.

As illustrated in FIG. 2, a step of positioning a cover 400 on the stack of layers 200 is executed next. The cover 400 is preferably coated on a first face with a layer of adhesive 300 before being deposited onto the stack of layers 200. The adhesive layer 300 is preferably spread over the whole surface of the cover 400. Advantageously, the cover 400 receives a first cleaning using a chemical treatment, so as not to introduce impurities into the system upon positioning thereof. Preferably, the cover 400 is made of a transparent material, so configured as to let the light through. The cover 400 is optionally made of glass. The cover 400 may optionally be made of plastics or metal. In a preferred embodiment, the cover is approximately 1 mm thick. Particularly advantageously, the cover 400 may have different shapes. For example, the cover 400 may have a prismatic, cylindrical or cubical shape.

The cover 400 advantageously has one opening so configured as to be a through opening. The cover 400 preferably has a second through opening. Particularly advantageously, the section of the opening provided in the plane of the OLED, perpendicular to the thickness of the OLED may have a polygon-, or an oblong shape, for example.

Figure 3:
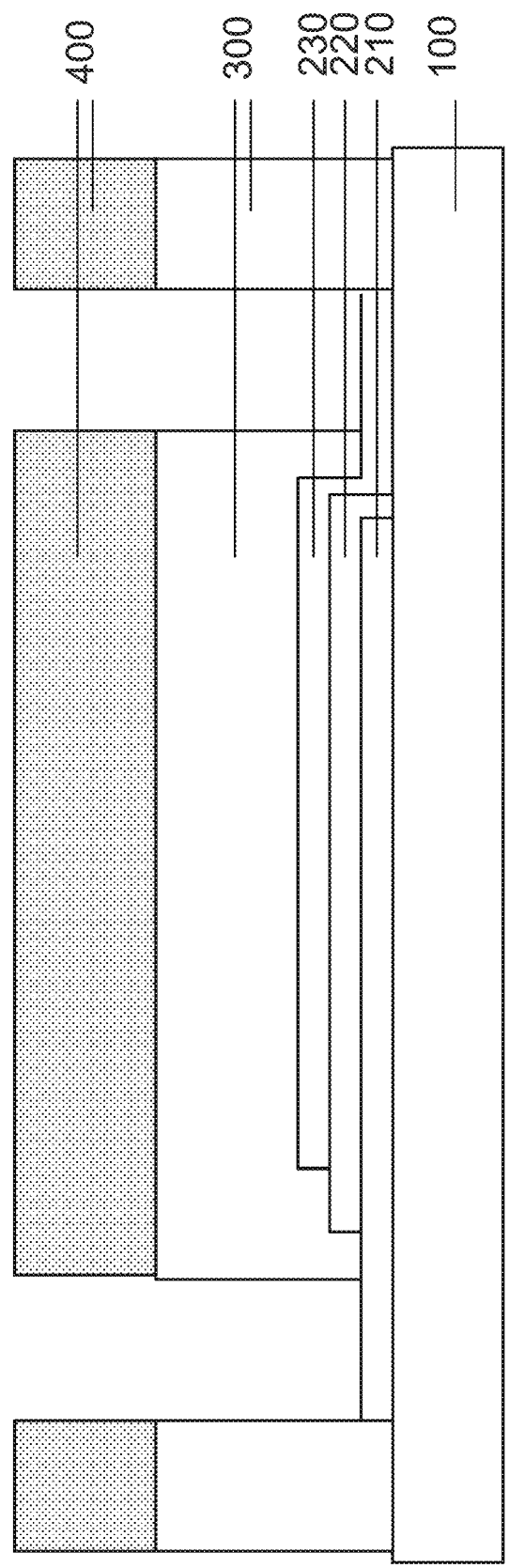
FIG. 3 illustrates the forming of openings giving access to the stack of layers, upon completion of the step of positioning the cover.

Upon completion of the step of positioning the cover 400, as shown in FIG. 3, the cover 400 and the adhesive layer 300 cover the stack of layers 200.

The adhesive layer 300 advantageously covers the whole organic layer 220. The adhesive layer 300 is preferably made of epoxy resist and has a viscosity ranging from 10 to 50,000 mPas·s. The required amount of adhesive layer 300 is determined according to the viscosity of the adhesive and in accordance with the desired thickness of the adhesive layer 300, after the step of positioning the cover 400.

The adhesive layer 300 has the advantage, once dry, of no longer reacting with water or with oxygen (i.e. the first degradation factors of the organic materials). The adhesive layer 300, thus deposited, particularly preferably acts as a waterproof protective barrier for the sensitive layers such as the first electrode 210, the organic layer 220 and the second electrode 230.

According to a preferred embodiment, an area of the protruding part of the first electrode 210 and an area of the protruding part of the second electrode 230 are not covered (neither by the adhesive, nor by the cover). Advantageously, at least one opening in the cover 400 is so configured as to be positioned in line with a not covered area of the protruding part of one of the electrodes 210, 230.

The cover 400 preferably has at least one opening preserving a space giving access to at least one of the electrodes 210, 230. The cover 400 advantageously has a second opening preserving a space giving access to at least a second electrode 210, 230.

In a preferred embodiment, the smallest dimension of one opening, specifically the width thereof, is at least 100 times greater than the thickness of the stack comprising the first electrode 210, the organic layer 220, the second electrode 230 and the adhesive layer 300. More preferably, the dimensional ratio is at least 1,000. For example, such a stack has a thickness in the range of 300 to 400 nm, whereas an opening has a minimum width of 0.4 mm. The adhesive layer 300 thus does not spread on the space(s) giving access to the electrodes 210, 230. The encapsulation thus obtained is perfect and at least one area of the protruding part of one of the electrodes 210, 230 is protected and does not receive, or only partially receives adhesive 300. According to one embodiment, an adhesive thickness between 10 μm and 500 μm, makes it possible to obtain a layer of adhesive 300 having a thickness of preferably less than 20 microns.

The opening in the cover 400 is so configured as to be positioned in line with the protruding part of one of the electrodes 210, 230, thus acting as an additional protective barrier.

According to one not illustrated embodiment, the cover 400 may not have any opening. In this case, the dimensions and the shape of the cover 400 are so configured as to preserve a space giving access to at least one electrode 210, 230, in line with the side edges of the cover 400.

Figure 4:
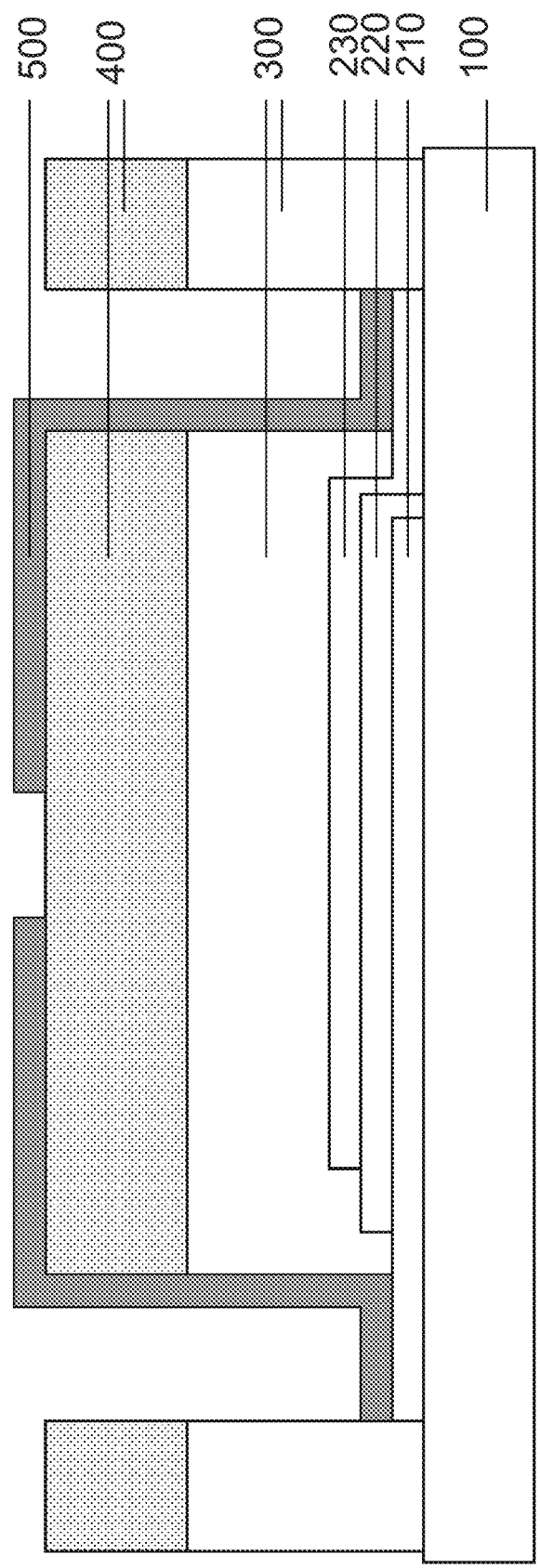
FIG. 4 illustrates the step of forming the connection pad which covers at least a portion of the second face of the cover and at least a portion of one of the electrodes.

A step of forming a connection pad 500 is then performed, as shown in FIG. 4.

In a preferred embodiment, the connection pad 500 comprises:
- a first portion parallel to the substrate 100, covering the area of the protruding part of one of the electrodes 210, 230 not covered.
- a second portion which extends on the edge, along the thickness of the cover 400.
- a third portion, covering a part of the face of the cover 400 which is not covered by the adhesive layer 300.

The connection pad 500 is advantageously made of a layer of copper, aluminum, silver, chromium, gold, molybdenum or nickel.

According to one embodiment, the connection pad 500 comprises a two-layer stack of materials selected from the following combinations: copper/aluminum, copper/silver, copper/molybdenum, copper/chromium, copper/nickel, copper/gold. The connection pad 500 preferably comprises a two-layer stack of materials, the layers of which are so configured as to be completely or partially superimposed.

Advantageously, the connection pad 500 is provided by vacuum deposition. It can be deposited, preferably by thermal evaporation. In an alternative solution, it can also be deposited by cathode sputtering.

The vacuum deposition method for the connection pad 500 has the advantage of not heating the substrate 400, which remains at a temperature below 40° C., thanks to the existing vacuum. This method consumes little energy. Advantageously, the ambient vacuum ensures the purity of the deposit, and therefore prevents the incorporation of impurities more particularly in the stack of layers 200; with said stack comprising sensitive layers such as the organic layer 220, the first electrode and the second electrode 210, 230.

According to a preferred embodiment, the vacuum deposition makes it possible to obtain a thin layer of the connexion pad 500, having a thickness between a few nanometers and a few microns (e.g. between 50 nanometers and 5 microns).

Particularly advantageously, a thickness of 1 micron of the connection area 500 is sufficient for a thickness of 1 millimeter of the cover 400.

Advantageously, the connection pad 500 totally covers the access openings, thereby protecting the organic layer 220 against potential water and oxygen ingress.

The connection pad 500 is preferably formed in an inert atmosphere. It has the advantage of encapsulating the space(s) giving access to the electrodes 210, 230 without any risk of residual oxygen and water.

Figure 5:
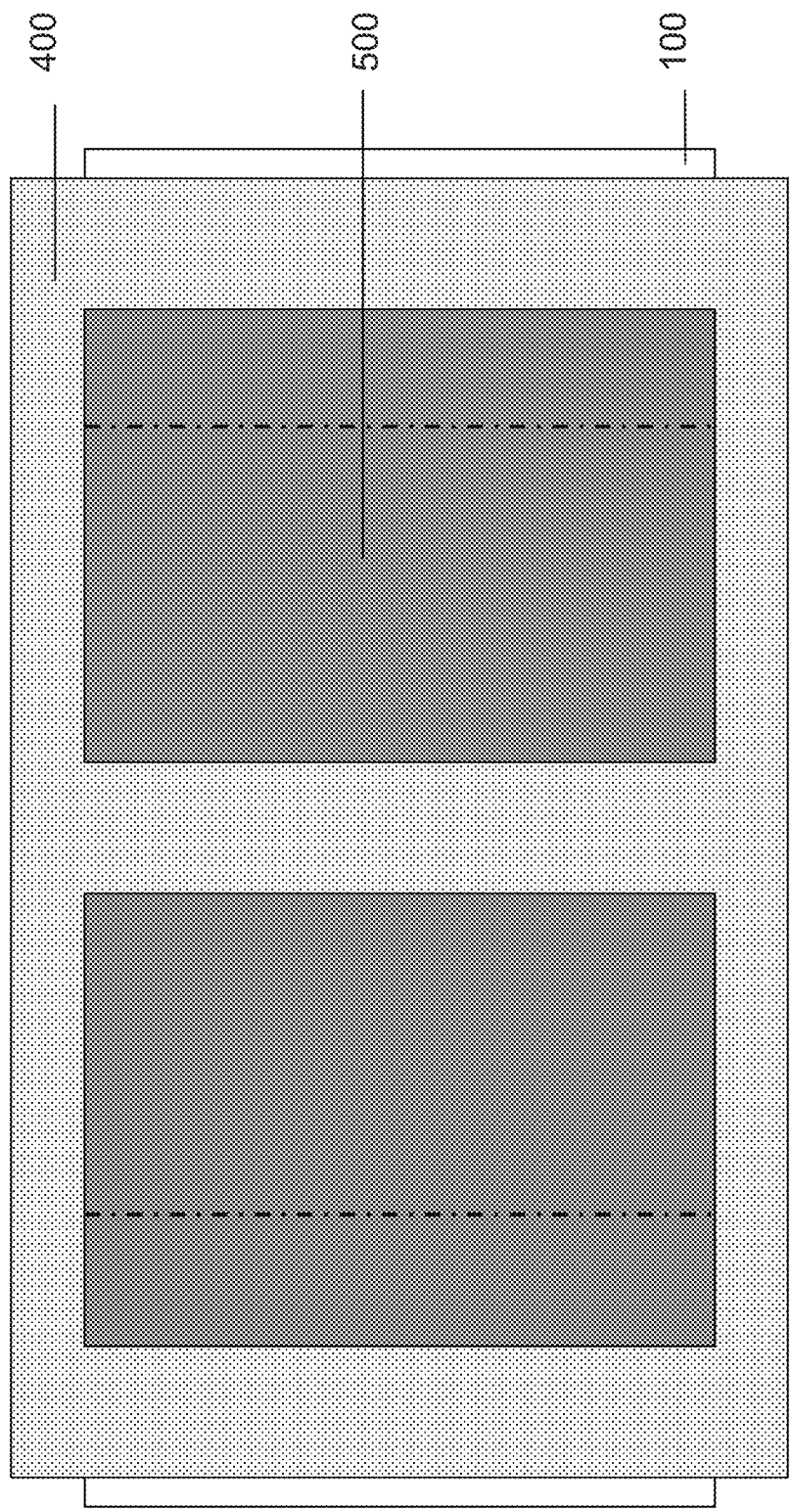
FIG. 5 is a schematic partial top view of FIG. 4, and shows the connection pad covering a portion of the cover and the access openings.

A partial schematic top view of FIG. 4 is shown in FIG. 5. The connection pad 500 preferably covers a part of the cover 400 and at least one space giving access to the electrodes 210, 230.

Particularly advantageously, it becomes possible to connect at least one elongated electrical connection member 600 at any location on the cover 400 covered by the connection pad 500, especially in remote areas or areas outside the spaces giving access to the electrodes 210, 230.

Particularly advantageously, the vacuum deposition method used for the connection pad 500 enables a good adhesion of the metal on the substrate 100.

Preferably, the deposition of the connection pad 500 in contact with the first electrode 210 and the deposition of the connection pad 500 in contact with the second electrode 230 are provided so as to be convergent. Advantageously, the edge of the connection pad 500 in contact with the first electrode 210 is spaced from the edge of the connection pad 500 in contact with the second electrode 230 by a few nanometers.

Advantageously, the pad 500 is so configured as to provide a great freedom as regards the position and the nature of the elongated electrical connection members(s) 600. As a matter of fact, the pad 500 has the advantages of being thin (about 1 micron) and of having a sufficient mechanical strength to perfectly follow the cover topography 400. Uniform and unaffected conductivity is thus obtained.

The projecting part of the first electrode 210 gives an electrical access through the upper part of the device, and more precisely through the cover.

Figure 6A:
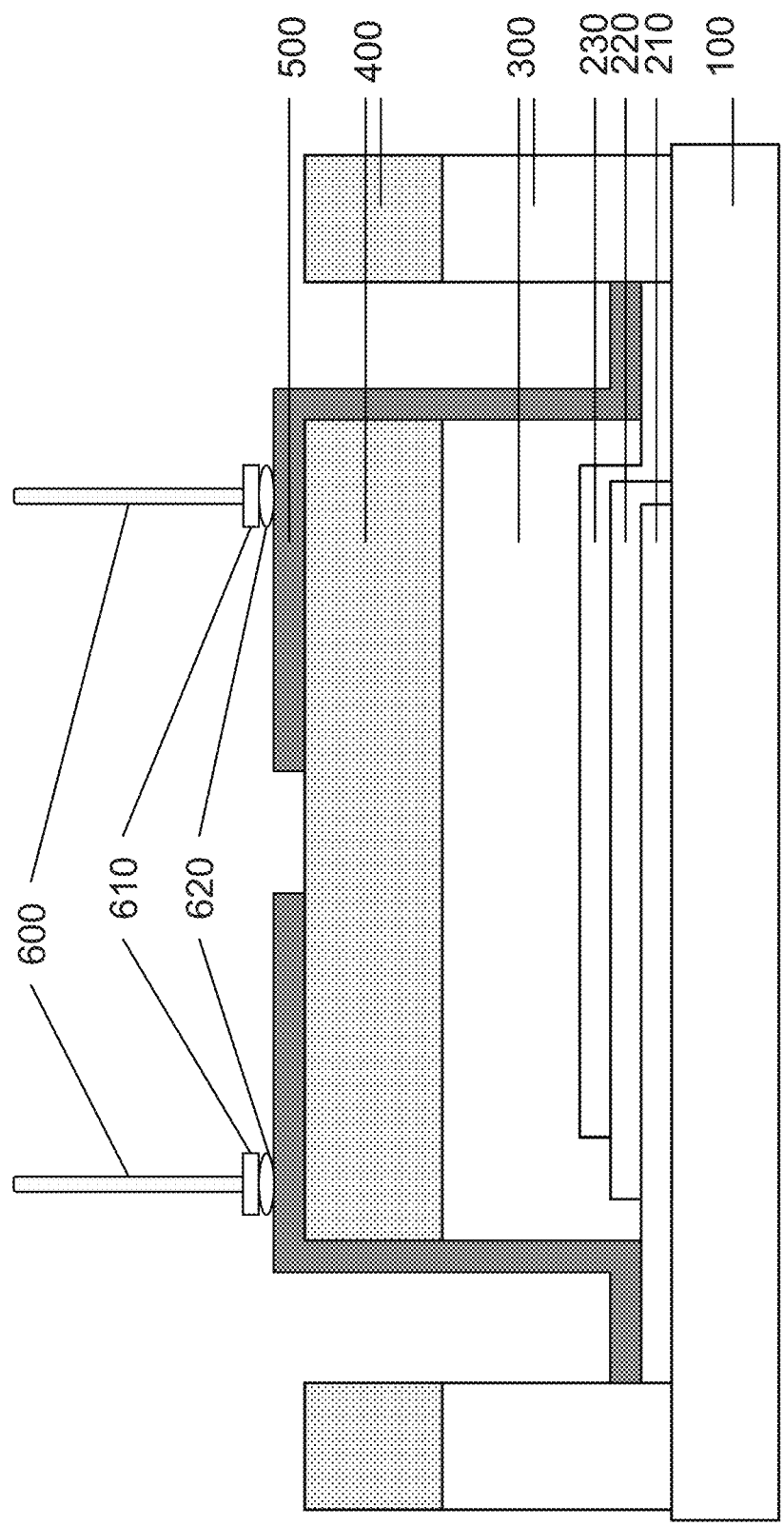
FIGS. 6a and 6b illustrate the steps of fixing at least one end of an elongated electrical connection member, achieved by bonding or soldering, respectively.
Figure 6B:
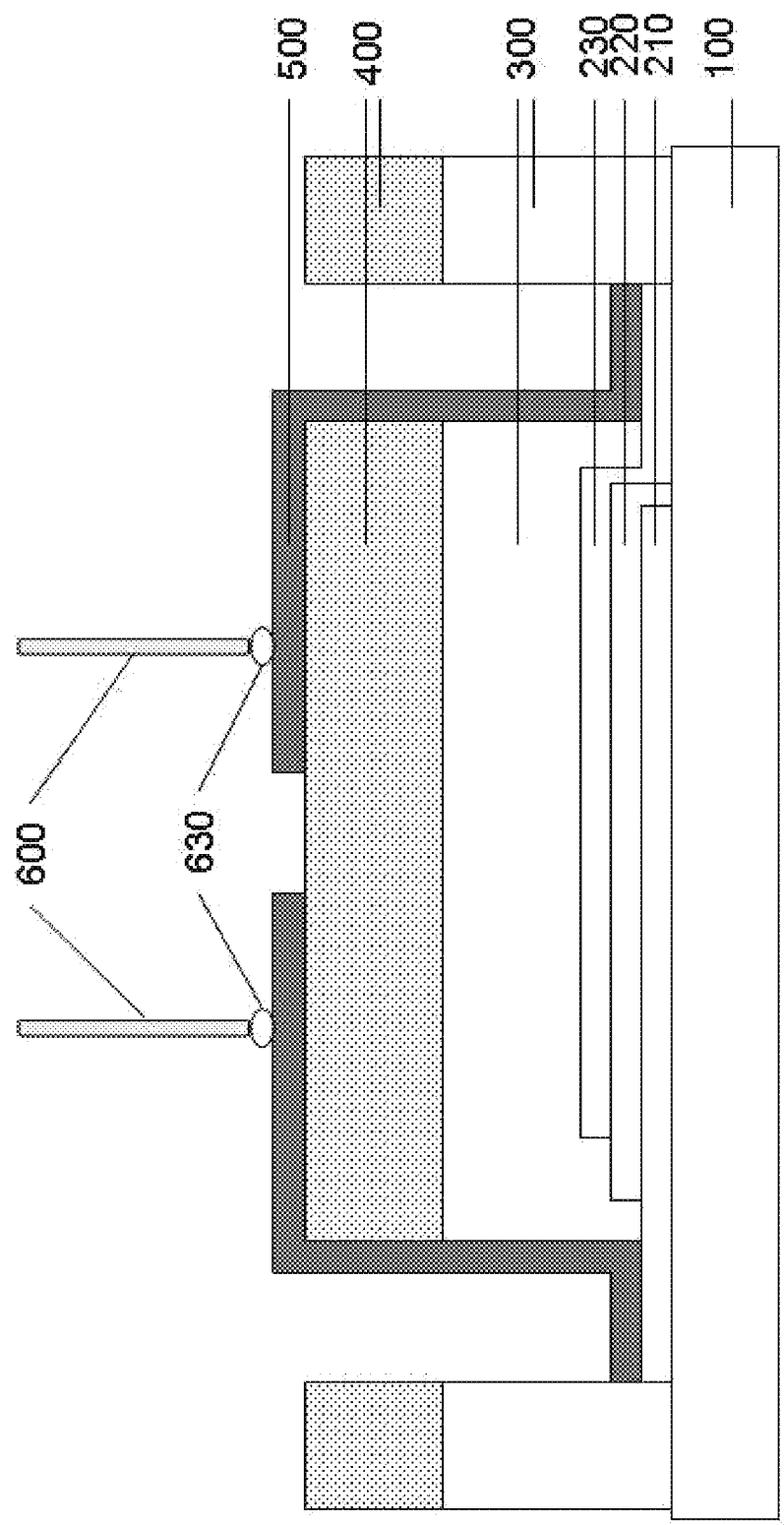

The steps of fixing at least one elongated electrical connection member are illustrated in FIGS. 6a and 6b.

Preferably, the elongated electrical connection member 600 is an electrically conductive member having an elongated shape, at least a longitudinal dimension of which is at least 5 times greater than the transverse thickness. Advantageously, the elongated electrical connection member 600 may be an electrical wire, a metal leg or a pin.

Particularly advantageously, a first end of an elongated electrical connection member 600 may be fixed to the connection pad 500 by soldering or brazing. Preferably, one end of an elongated electrical connection member is fixed directly to the connection pad 500 using tin 630. End means a part located at an extreme edge of the elongated member in a longitudinal direction.

In an alternative embodiment, a first end of an elongated electrical connection member 600 may also be fixed to the connection pad 500 by bonding. Preferably, one end of an elongated electrical connection member is bonded onto the connection pad 500 using a brass patch 610 and a conductive paste 620. The conductive paste 620 is preferably a silver lacquer. Silver lacquer advantageously avoids a localized heating at the solder.

According to a preferred embodiment, an elongated electrical connection member 600 connected to the first electrode 210 i.e. the anode can be fixed close to an elongated electrical connection member 600 connected to the second electrode 230 i.e. the cathode.

Particularly advantageously, soldering or and elementary conductive adhesive will be sufficient to provide the electrical contact away from the access openings.

Particularly advantageously, the method makes it possible to avoid the heat treatments, which may be located close to at least one of the electrodes 210, 230 and/or the organic layer 220.

Figure 7A:
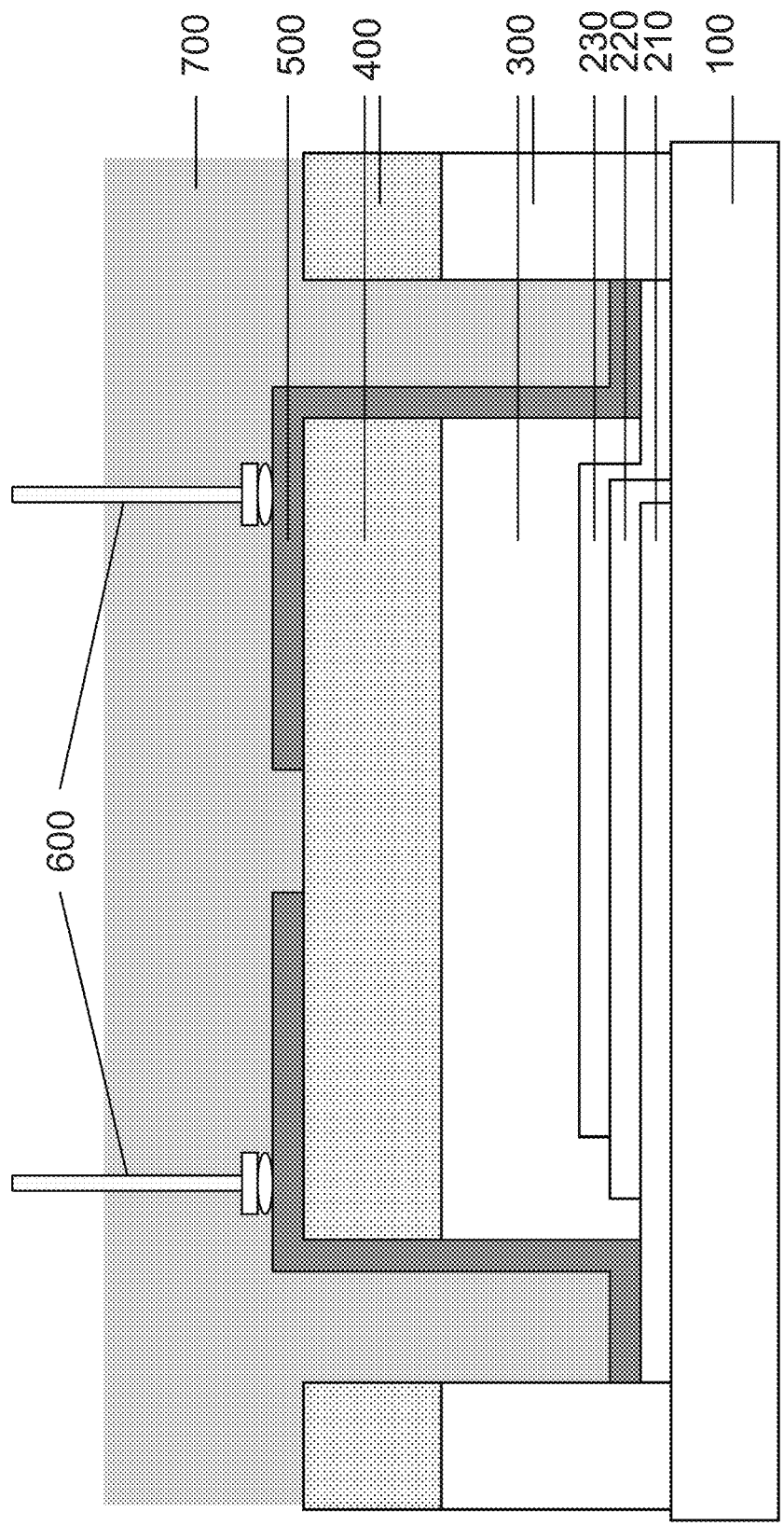
FIGS. 7a and 7b illustrate the step of forming a layer of resist so configured as to preserve an electrical access to a second end of the elongated electrical connection member above the layer of resist.
Figure 7B:
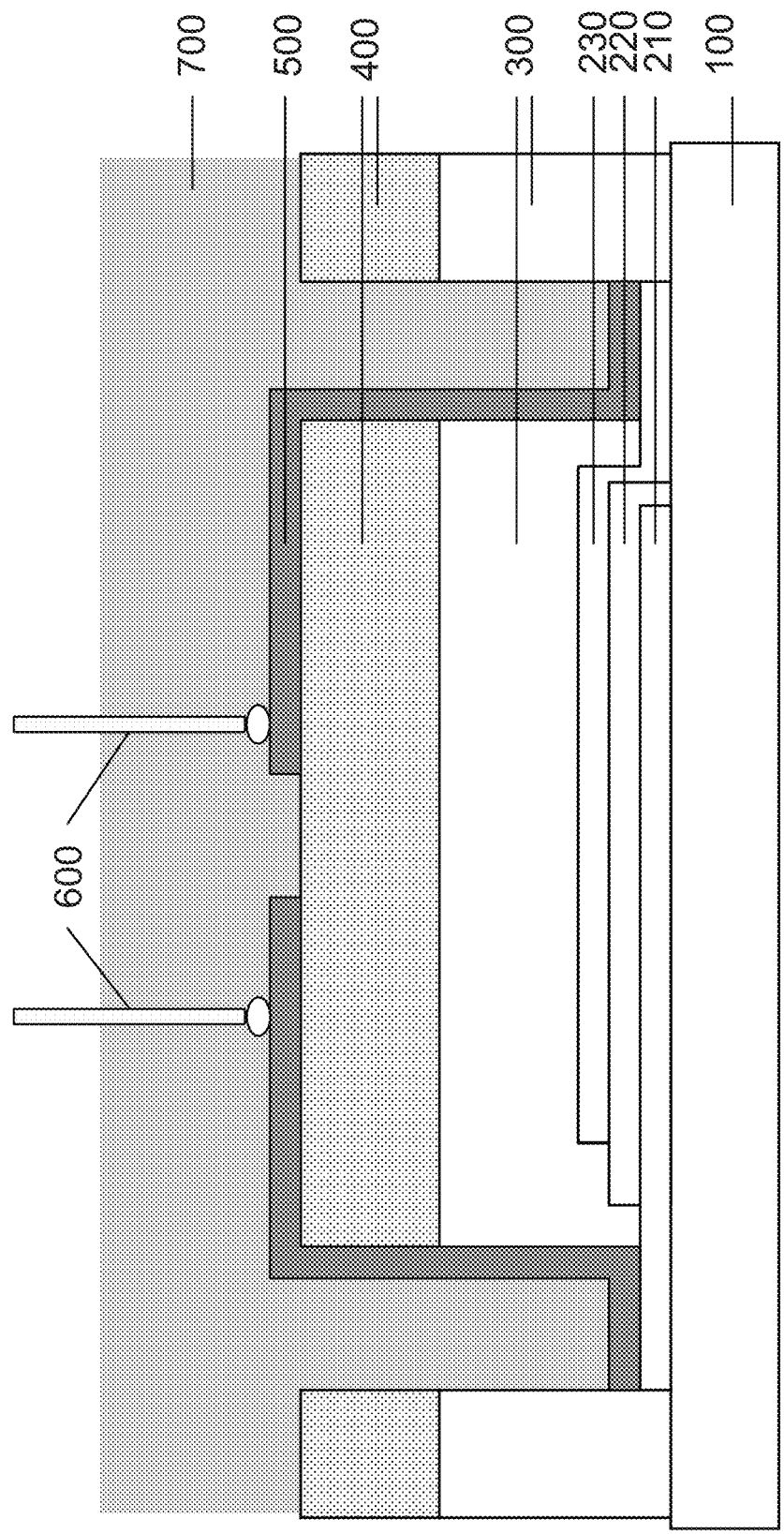

A step of forming a layer of resist 700 is illustrated in FIGS. 7a and 7b. Advantageously, the layer of resist 700 covers the whole OLED device, so as to encapsulate and to protect the organic layer 220 and the electrodes 210, 230. The layer of resist 700 advantageously fills the spaces giving access to the electrodes 210, 230.

The thus positioned layer of resist 700 particularly preferably acts as a waterproof protective barrier for the sensitive layers such as the first electrode 210, the organic layer 220 and the second electrode 230.

Particularly advantageously, the layer of resist 700 is so configured as to preserve an electrical access to a second end of the elongated electrical connection member 600 above said layer of resist 700.

The layer of resist 700 advantageously makes it possible to protect and strengthen the attachment on the connection pad 500, of at least one of the elongated electrical connection members 600.

The present invention thus provides a particularly simple, rapid and reliable method for producing an organic light emitting device having at least one elongated electrical connection member 600.

Preferably, the encapsulated OLED device is compatible with industrial requirements, also with large areas.

The invention is not limited to the embodiments described above but applies to all the embodiments complying with the spirit thereof.

REFERENCES

100. Substrate
200. Stack of layers
210. First electrode
220. Organic layer
230. Second electrode
300. Adhesive layer
400. Cover
500. Connection pad
600. Elongated electrical connection member
610. Brass patch
620. Conductive paste
630. Tin
700. Layer of resist

The invention claimed is:

1. A method for manufacturing an organic light emitting device, the method comprising the following sequences of steps:
   a step of forming a stack of layers on a substrate, said stack comprising, successively, a first electrode positioned on the substrate, an organic layer positioned in contact with at least a portion of the first electrode, a second electrode positioned in contact with at least a portion of the organic layer,
   a step of positioning a cover, a first face of which is bonded using an adhesive layer, with said cover being positioned on the stack of layers, so that the adhesive layer fits the cover and the stack of layers,
   a step of forming a connection pad so executed that the connection pad covers at least a portion of the second face of the cover and at least a portion of one of the electrodes,
   wherein, successively:
      a step of fixing a first end of at least one elongated electrical connection member to an area of the connection pad covering a portion of the second face of the cover,
      a step of forming a layer of resist covering the entire device; with said layer of resist being so configured as to preserve an electrical access to a second end of the elongated electrical connection member above the layer of resist.

2. The method according to claim 1, wherein the step of positioning the cover is so configured as to preserve a space giving access to at least one of the electrodes; with said cover having at least one opening.

3. The method according to claim 1, wherein the step of positioning the cover is so configured as to preserve a space giving access to at least a second electrode; with said cover having at least one second opening.

4. The method according to claim 1, wherein the step of positioning the cover, which creates at least two access spaces, is so configured as to frame the organic layer while preserving the insulation thanks to the layer of resist.

5. The method according to claim 1, wherein the step fixing a first end of at least one elongated electrical connection member comprises soldering.

6. The method according to claim 1, wherein the step of fixing a first end of at least one elongated electrical connection member comprises bonding.

7. The method according to claim 1, wherein the elongated electrical connection member is an electrically conductive member having an elongated shape, selected from an electric wire, a metal leg or a pin.

8. The method according to claim 1, wherein the step of forming the connection pad comprises a metallization.

9. The method according to claim 1, wherein the step of forming the connection pad comprises a vacuum deposition.

* * * * *